United States Patent
Cormode et al.

(10) Patent No.: US 7,450,032 B1
(45) Date of Patent: Nov. 11, 2008

(54) SYSTEM AND METHOD FOR ENCODING A SIGNAL USING COMPRESSED SENSOR MEASUREMENTS

(75) Inventors: Graham Cormode, Summit, NJ (US); Shanmugavelayutham Muthukrishnan, Washington, DC (US)

(73) Assignee: AT & T Intellectual Property II, L.P., Reno, NV (US)

( * ) Notice: Subject to any disclaimer, the term of this patent is extended or adjusted under 35 U.S.C. 154(b) by 427 days.

(21) Appl. No.: 11/320,373

(22) Filed: Dec. 27, 2005

(51) Int. Cl.
*H03M 7/00* (2006.01)
(52) U.S. Cl. .......................... 341/50; 341/87
(58) Field of Classification Search ............. 341/50, 341/87; 706/20; 375/148
See application file for complete search history.

(56) References Cited

U.S. PATENT DOCUMENTS

| | | | |
|---|---|---|---|
| 6,310,897 B1 | 10/2001 | Watanabe et al. | |
| 6,686,879 B2 | 2/2004 | Shattil | |
| 6,937,769 B2 | 8/2005 | Onno | |
| 6,954,721 B2 | 10/2005 | Webber | |
| 6,963,842 B2 | 11/2005 | Goodwin | |
| 7,271,747 B2 * | 9/2007 | Baraniuk et al. | 341/87 |
| 7,321,695 B2 * | 1/2008 | Schwartz | 382/239 |

* cited by examiner

*Primary Examiner*—Rexford Barnie
*Assistant Examiner*—Joseph Lauture
(74) *Attorney, Agent, or Firm*—Fay Kaplun & Marcin, LLP

(57) ABSTRACT

Described is a system and method for receiving a signal for transmission and encoding the signal into a plurality of linear projections representing the signal. The encoding includes defining a transform matrix. The transform matrix being defined by processing the signal using a macroseparation matrix, processing the signal using a microseparation matrix and processing the signal using an estimation vector.

14 Claims, 3 Drawing Sheets

Defining the Transform Matrix and Reconstruction of Coefficients-- 300

SYSTEM AND METHOD FOR ENCODING A SIGNAL USING COMPRESSED SENSOR MEASUREMENTS

INCORPORATION BY REFERENCE

The application entitled "System and Method for Decoding a Signal Using Compressed Sensor Measurements," naming Graham Cormode and Shanmugavelayutham Muthukrishnan as inventors and filed on an even date herewith, is hereby incorporated herein, in its entirety.

BACKGROUND

Approximation Theory assists in the science and math of reconstructing signals. The general principles of Approximation Theory are concerned with how functions may be approximated with other, simpler functions, and with characterizing in a quantitative way, the errors introduced thereby. With signal reconstruction, the fundamental problem is to reconstruct a signal that is a vector (or series) of Real Numbers from linear measurements with respect to a dictionary for vectors of Real Numbers. Currently through the use of Approximation Theory, there are vast computations involved in order to reconstruct a signal.

Current developments in Approximation Theory have evolved a new field within it that allows for fewer computations in order to reconstruct a signal. This new field is called Compressed Sensing. With Compressed Sensing, reconstruction of a signal may be done with very few linear measurements over a modified dictionary if the information of the signal is concentrated in coefficients over an orthonormal basis. These results have reconstruction error on any given signal that is optimal with respect to a broad class of signals. The field of Compressed Sensing allows for an innovative approach to allow a much smaller number of calculations than the signal size to reconstruct a signal but there is yet no method developed to accomplish this using an algorithmic approach. An algorithmic approach allows showing that Compressed Sensing results resonate with prior work in Group Testing, Learning theory, and Streaming algorithms. Current technology needs a new method that allows these new algorithms to present the most general results for Compressed Sensing with an approximation on every signal, faster algorithms for the reconstruction as well as succinct transformations of the dictionary to the modified dictionary.

SUMMARY OF THE INVENTION

A method including receiving a signal for transmission and encoding the signal into a plurality of linear projections representing the signal.

A system having a receiving module to receive a signal for transmission and an encoding module to encode the signal into a plurality of linear projections representing the signal.

A computer readable storage medium including a set of instructions executable by a processor. The set of instructions operable to receive a signal for transmission and encode the signal into a plurality of linear projections representing the signal.

DETAILED DESCRIPTION

Figure 1:
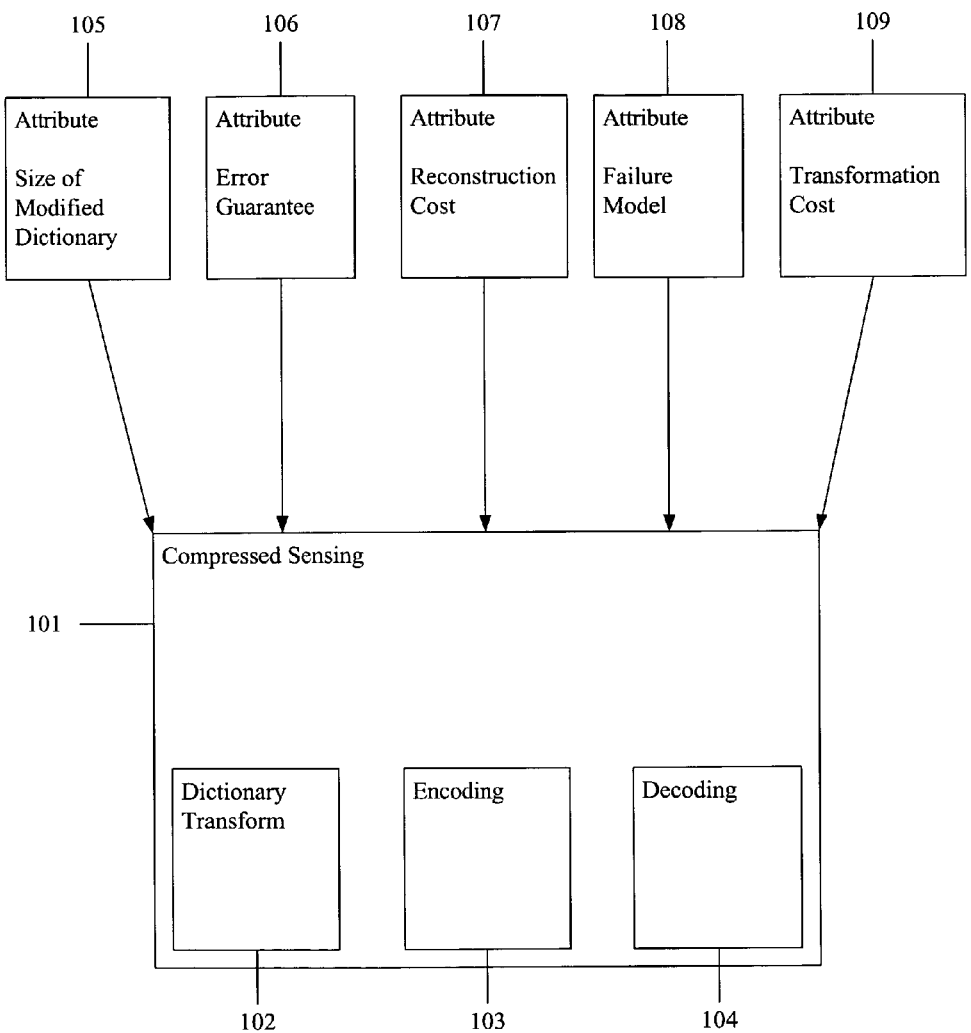
FIG. 1 shows an exemplary method of a compressed sensing scheme with different attributes that are considered in addition to elementary steps involved with the method according to the present invention.

The present invention may be further understood with reference to the following description and the appended drawings, wherein like elements are referred to with the same reference numerals. The exemplary embodiment of the present invention describe a method for measuring signals using only a small number of linear projections and then reconstruct the entire signal approximately using these projections. The linear projections and reconstruction will be further discussed in detail below.

In the exemplary embodiments, an exemplary signal processor is used as the medium for an exemplary signal encoding and decoding including reconstruction. The exemplary signal processor may include a signal processor for a network monitoring device such as a firewall or router. However, those of skill in the art will understand that the present invention applies to any unit that it required to process a signal. In addition, the functionality described herein for the encoding and decoding of the signals may be implemented via any type of hardware and/or software or combination thereof. Thus, the herein described functionality may be implemented as software modules or elements that are executed by a processor.

The present invention involves a series of matrices that are used to describe what linear measurements of the signal to take and a decoding algorithm that is used to reconstruct an approximate signal from the measurements. The series of matrices may also be further deconstructed into three steps of matrix construction: macro separation, micro separation, and estimation. All three steps will be discussed in detail below. The reconstruction of the signal is accomplished through a decoding algorithm that will also be discussed in detail below.

In the exemplary embodiments, $\Psi$ will denote a dictionary with an orthonormal basis for $R^n$ (real numbers) (i.e., $\Psi$ is a set of n real-valued vectors $\psi_i$ each of length n and $\psi_i$ is perpendicular to $\psi_j$ ($\psi_i \perp \psi_j$)). A signal vector A, where A is a vector, in $R^n$ is transformed by the dictionary $\Psi$ into a vector of coefficients $\theta(A)$ (i.e., $\theta$ as a function of A) formed by inner products between A and vectors from $\Psi$ (i.e., $\theta_i(A) = <A, \psi_i>$ and $A = \Sigma_i \theta_i(A) \psi_i$ by the orthonormality of $\Psi$, where $\theta_i$ is referred to when A is implicitly clear. By Parseval's equality (square of the norm value x equals the inner product of x and x which equals the sum of the inner products of x and v squared where v is an element of B and where B is an orthonormal basis in an inner-product space $$\left(\text{i.e., } \|x\|^2 = \langle x, x \rangle = \sum_{e \in B} \langle x, v \rangle^2\right), \sum_i \theta_i^2 = <A, A> = \|A\|_2^2$$

(i.e., the "energy" (sum of squares of values) of the signal is preserved under transformation by an orthonormal basis), where $\|A\|_2^2$ is the square of the Euclidean norm of vector A that is defined as $$\sqrt{\sum_{i=1}^{n} |x_i|^2},$$

where x=A.

The present invention utilizes Sparse Approximation Theory where sparse representations (R) of A are sought (i.e., use few coefficients). Sparse Approximation Theory is the practice of representing a given signal as a summation of elements from a dictionary of elementary signals. Formally, R equals the sum of the product of $\theta_i$ and $\psi_i$ where i is an element of K and K is some set of coefficients where the absolute value of K equals k that is much smaller than n (i.e., $R=\Sigma_{i\in K}\theta_i\psi_i$ and $|K|=k<<n$). Thus, R(A) (i.e., R as a function of A) cannot exactly equal the signal A for all signals. An error exists and is typically taken as the Euclidean norm value of the square difference vector R less A which equals the sum of the squares of $R_i$ less $A_i$ (i.e., $\|R-A\|_2^2=\Sigma_i (R_i-A_i)^2$). Using Parseval's equality, this is equivalently equal to the square of the Euclidean norm value of $\theta(A)$ less $\theta(R)$ (i.e., $\|\theta(A)-\theta(R)\|_2^2$).

For the optimal k representation of A under $\Psi$, $R_{opt}^k$ takes k coefficients with the largest absolute value of $\theta_i$'s. In the exemplary embodiments, for purposes of convenience, it will be assumed that the order of the absolute value of the vectors in the dictionary go from $\theta_1$ as largest to $\theta_n$ as smallest (i.e., $|\theta_1|\geq|\theta_2|\geq \ldots |\theta_n|$). The error may be reformulated to be represented as the square of the Euclidean norm of the difference vector A less $R_{opt}^k$ which equals the sum of the squares of $\theta_i$ from i to n where i holds a value of k+1 (i.e., $\|A-R_{opt}^k\|_2^2=\Sigma_{i=k+1}^n \theta_i^2$).

Under Sparse Approximation Theory, three specific cases arise that apply to the exemplary embodiments of the present invention. In a k-support case, if the signal has at most k non-zero coefficients under $\Psi$, $R_{opt}^k$ will have zero error (i.e., $\|R_{opt}^k-A\|_2^2=0$) and hence, A may be exactly reconstructed. In a p-Compressible case, in the area of sparse approximation theory, functions that are compressible with respect to $\Psi$ are studied. Specifically, the coefficients have a power-law decay (i.e., for some $p\in(0,1)$, $|\theta_i|=O(i^{-1/p})$ for a constant C where O is Big-Oh notation that denotes an upper bound often used to state the complexity of the worst case analysis). Consequently, the square of the Euclidean norm value of the difference vector A less $R_{opt}^k$ will be less than or equal to $C'k^{1-2/p}$ for some constant C' which is a function of C and p (i.e., $\|A-R_{opt}^k\|_2^2\leq C'k^{1-2/p}$, $C'=C'(C,p)$). In a general case, if A is arbitrary, for a given k, $R_{opt}^k$ will have some arbitrary error. It should be noted that these cases are specific to the exemplary embodiment of the present invention and that other cases under Sparse Approximation Theory exist.

Recent discoveries in Sparse Approximation Theory allow for Compressed Sensing where $\Psi$ may be transformed into a smaller dictionary, $\Psi'$, that contains O as a function of k log n vectors in $R^n$. This results in the p-compressible case described above for p-compressible signals. The error is within constant factors of optimal k-term representation over the class of all such compressible signals. The size of $\Psi'$ will be significantly smaller than n (i.e., $\Psi'<<n$). It is also near-optimal in terms of the size of $\Psi'$ since at least k linear measurements to measure even the k non-zero coefficients in a signal with k-support is necessary.

The present invention formalizes the different algorithmic aspects of the Compressed Sensing problem. The problem is related to group testing, Fourier transform estimation and data stream algorithms. The present invention utilizes algorithms for the compressed sensing and the focus is on obtaining error bounds for the instance of the signal, rather than a whole class. The method of using algorithms for the present invention will be discussed below.

FIG. 1 shows an exemplary method of a compressed sensing scheme 100 on which the present invention may be implemented. The Compressed Sensing 101 is composed of three parts: dictionary transform 102, encoding 103, and decoding 104. Dictionary transform 102 involves building a set $\Psi'$ from the orthonormal bias $\Psi$ with m vectors of length n. Encoding 103 involves encoding vectors A by $\Psi'$ to give a set of coefficients $\theta_i'$ which is the inner product of $\psi_i'$ and A (i.e., $\theta_i'=<\psi_i', A>$). Decoding 104 involves recovering a representation of A under $\Psi$ given the m values $\theta_i'$.

The present invention focuses on certain attributes in evaluating the quality of such a scheme. The attributes include a size of $\Psi'$ 105, an error guarantee 106, a reconstruction cost 107, a failure model 108, and a transformation cost 109. It should be noted that these attributes are only exemplary and other attributes may be used in evaluating the quality of the scheme.

The size of $\Psi'$ 105 determines the number of measurements required to give an accurate reconstruction of A, given a desired accuracy. This is lower bounded by the information needed to do the reconstruction even if no consideration of computational requirements of doing the transformation or decoding is taken. At least k measurements are necessary to compute the best k term representation. If k-support signals exist, a k log (n/k) lower bound follows from group testing. Consequently, the proximity to these bounds is evaluated.

The error guarantee 106 considers if the given instance of the signal (i.e., instance-optimal) or the worst case error over a class of functions (i.e., class optimal) (e.g., error $C'k^{1-2/p}$ for the p-compressible class of functions) will make conditions optimal. Regarding algorithms, instance-optimal is preferred since any given signal could have a best representation with much smaller error than the worst case over its entire class. For the k-support case, instance-optimal and class optimal are viable options since the class-optimal error is zero.

The reconstruction cost 107 considers the amount of time necessary to reconstruct the signal. Such a consideration would be critical, for example, in applications. There is no requirement in the specification of the problem that the output be a sparse representation of A (i.e., with bounded support). This is because the representation to be close to optimal in error is sought and there is no prescribed requirement on the sparseness of the output. Thus, decoding takes time $\Omega(n)$, where $\Omega$ represents time as a function. However, since the signal has sparse representation, it is desirable to be efficient and have decoding only depend on the size (i.e., number of vectors) of $\Psi'$.

The failure model 108 considers the probability the construction fails to give the required accuracy by determining whether the success depends on the signal or whether $\Psi'$ will work for all possible signals. Although all constructions of $\Psi'$ are probabilistic, if the failure probability is exponentially small in n and k then, for a sufficiently restricted class of signals, there must exist $\Psi'$ that works for any signal in the class. Such non-adaptive transformations are desirable. Otherwise, the failure probability is typically polynomially small (i.e., $n^{-c}$ for some constant c).

The transformation cost 109 considers the resource bounds for the transformation in terms of the amount of time necessary for the transformation and how succinctly $\Psi'$ may be described. Succinctness depends on how many bits are needed to write down $\Psi'$ when $\Psi$ is the standard basis. The minimum number of bits necessary is log (mn). It should be noted that O (mn) bits are not necessary since Ψ' may be implicitly specified (e.g., one may use hash functions).

The present invention performs the Compressed Sensing depending on the type of signal. Fundamentally, algorithms used in Compressed Sensing rely on the Basis Pursuit Model, which is to solve the linear program to find the vector A' to minimize the one norm of the difference vector Ψ' multiplied by A' less Ψ' multiplied by A (i.e., ∥Ψ'A'−Ψ'A∥). The one norm of a vector (i.e., Manhattan norm) is defined as follows:

$$\|x\|_1 := \sum_{i=1}^{n} |x_i|.$$

Further, Ψ' is typically chosen as a random matrix, whose entries are independent and identically distributed as Gaussian, Bernoulli or ±1. However, current algorithm analyses result in various failure models and the size of Ψ' that is necessary. The method the present invention utilizes for algorithms in Compressed Sensing is discussed below which, again, depends on the type of signal.

For arbitrary signals, a new randomized construction that produces a Ψ' with O as a function of k multiplied by the log of n, quantity raised to the power of 3, all divided by $\epsilon^2$ (i.e., $O((k \log^3 n)/\epsilon^2)$) vectors is produced. In addition, an algorithm that recovers a representation $R^k$ with k non-zero coefficients of vectors from Ψ so that the square of the Euclidean norm of the difference vector $R^k$ less A is less than or equal to the quantity one plus $\epsilon^2$ multiplied by the square of the Euclidean norm of the difference vector $R_{opt}^k$ less A (i.e., $\|R^k-A\|_2^2 \leq (1+\epsilon^2)\|R_{opt}^k-A\|_2^2$) with high probability is produced.

For p-compressible and k-sparse signals, the existence of a single transformation that will work for all input, later discussed, is shown. The dictionary is non-adaptive but the construction is also instance-optimal and requires more measurements. The generated matrix has the non-adaptive property as well. The results are naturally resilient to error. Provided at most a small fraction of measurements are corrupted, a representation of the signal to the same error bounds as before is recoverable.

For non-compressible (general) signals, the construction is instance-optimal, which is in contrast to prior compressed sensing results that are class-optimal over the restricted classes. The results are weaker since they require more inner products than the O as a function of k multiplied by log of n/k (i.e., O(k log n/k)) obtained in prior work for compressible signals. However, running time results are improved since prior works relied on solving a linear program of size Õ as a function of n multiplied by k (i.e., Õ(n/k)) which in general takes time cubic in the program size. It should be noted that the notation Õ suppresses factors of log n when it is small in comparison to other factors. Even for the k support case (only k non-zero coefficients), the prior results rely on Orthogonal Matching Pursuit, which is at least quadratic in k from preliminary empirical analysis, and the explicit group testing construction takes time Ω as a function of k to the fourth power (i.e., $\Omega(k^4)$). The present invention also only requires polylogarithmic bits of randomness of construct Ψ' so that construction of Ψ' is fast since Ψ' has a very succinct representation.

Prior analyses (e.g., Fourier transform estimation results, histogram/wavelet data stream algorithm, element algorithms on data streams) may be applied to the Compressed Sensing Problem to get a result similar to those described above for the present invention. However, unlike the Fourier transform estimation results, the present invention improves the bounds of k, $\epsilon^{-1}$, log n, and works for any orthonormal dictionary. In addition, unlike the histogram/wavelet data stream algorithm where the dependency on parameters is polynomially higher, the dependency on $\epsilon$, for example, is at least cubic. The present invention improves the running time by polynomial factors in k and $\epsilon$. The algorithm avoids any multiple pursuits required to decode and identify the coefficients. Instead, a single pass over the measurements suffices to reconstruct the signal. Also, unlike the element algorithms on data streams, the present invention gives stronger bounds on the accuracy of recovered coefficient values. The decoding time is much reduced than the Ω(n) cost of directly applying the prior methods as well.

Similar to prior analyses, the present invention obtains results by matrix transformations which are at the heart of group testing algorithms, Fourier sampling methods, and data stream algorithms. However, besides extracting all the ingredients needed for the result, the present invention achieves the main result by an improved analysis of these ingredients. For example, coefficients are estimated where the prior methods show accuracy depending on the Euclidean value of vector A (i.e., ∥A∥). The present invention will prove the accuracy in terms of the norm of the error of the difference of A and $R_{opt}^k$ (i.e., $A-R_{opt}^k$) which is significantly tighter.

The present invention sets out a goal to produce a set of m (i.e., row) vectors Ψ'. Ψ' is treated as a m×n matrix whose ith rows is $\Psi_i'$. When given the vector of measurements Ψ'A, an appropriate representation of A must be found. As mentioned above Ψ' is a function of Ψ and only matrices Ψ' that may be written as a linear combination of vectors from the dictionary, Ψ, are considered (i.e., Ψ'=TΨ, for some m×n transform matrix T). Thus, Ψ'A=T(ΨA)=Tθ. Also mentioned above, the best representation under Ψ using k coefficients is given by picking k largest coefficients from θ, and then using these to represent A. It is also shown that the error in this representation may be tightly bounded.

Figure 2:
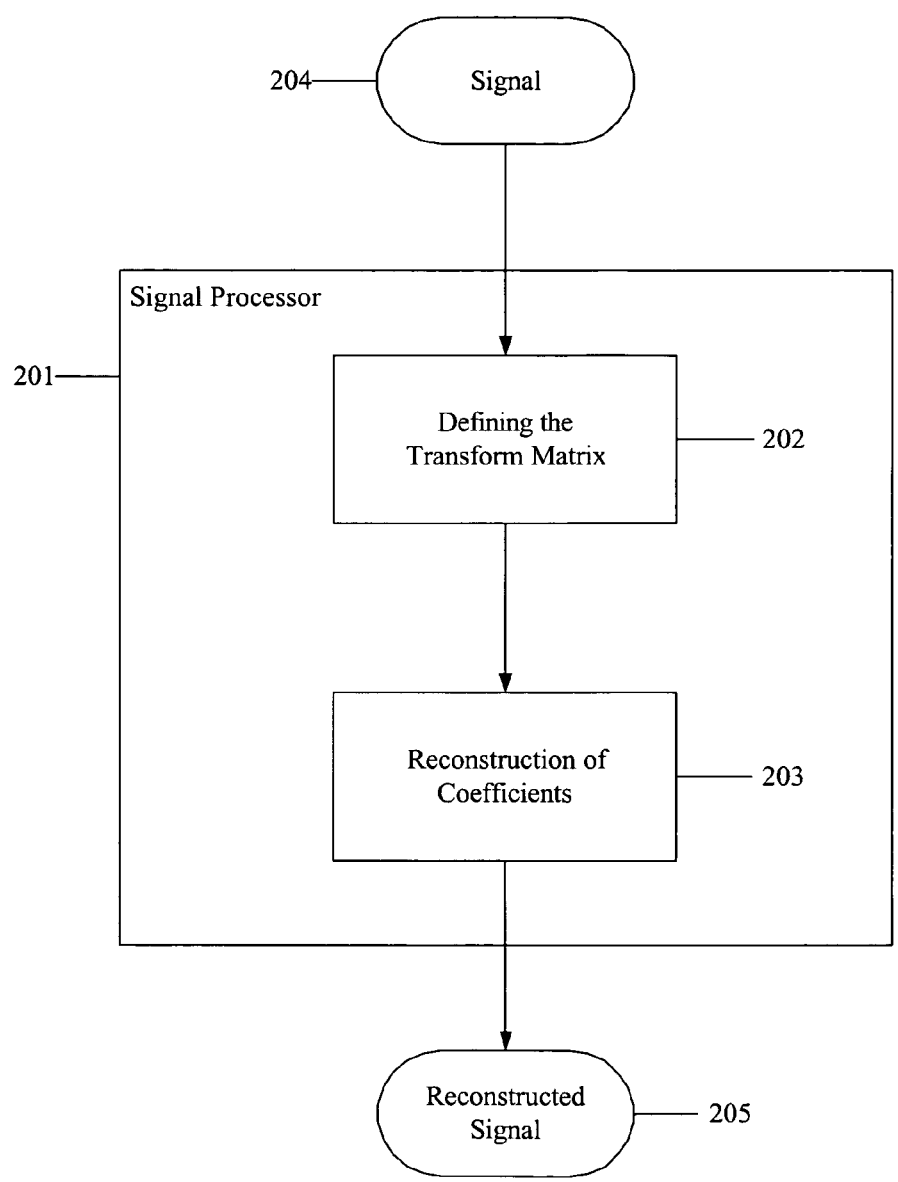
FIG. 2 illustrates an exemplary embodiment of the method to reconstruct a signal by a signal processor according to the present invention.

FIG. 2 illustrates an exemplary embodiment of the method to reconstruct a signal by a signal processor according to the present invention. When a signal processor 201 computes a signal 204, the signal 204 goes through the signal processor 201 and is put through two processes. First, the signal processor 201 defines the transform matrix 202 and second, reconstructs the coefficients 203. Upon completion of these two processes of the signal processor 201, a reconstructed signal 205 is created. Defining the transform matrix 202 and reconstruction of coefficients 203 will be discussed in detail below.

Figure 3:
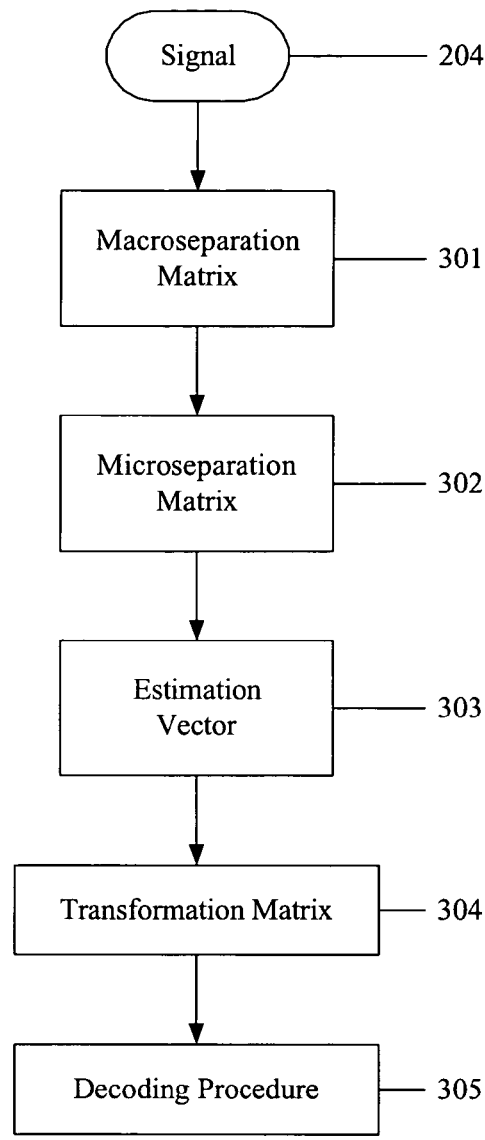
FIG. 3 illustrates an exemplary embodiment of the method to define a transform matrix and reconstruct coefficients according to the present invention.

FIG. 3 illustrates defining the transform matrix and reconstructing coefficients 300 which is the process of taking the signal 204 and putting it through the signal processor 201 in order to define the transform matrix 202 and reconstruct the coefficients 203. A transform matrix T recovers k coefficients approximately so that the error from using these k coefficients is within a $(1+\epsilon^2)$ factor of using the k largest coefficients from θ. Standard repetition techniques boost this to arbitrarily high probability for all large coefficients. Through the following process that defines the transform matrix, the necessary coefficients may be found and estimated using a decoding procedure 305.

To define the transform matrix 202, the signal is placed through two matrices and a vector in order to get a transformation matrix 304. The signal goes through a macroseparation matrix 301, then to a microseparation matrix 302, and finally to an estimation vector 303.

The macroseparation matrix 301 spreads out the coefficients from one another so that they may be identified without any interference from each other. If the macroseparation matrix is denoted as S, then S is 0/1 s×n matrix with the property that for every column, exactly one entry is 1 and the rest are 0. If S is based on a function g that linearly transforms matrix n to matrix s, then the probability of g as a function of i equal j is 1/s for every i that is an element of the matrix n and for every j that is an element of the matrix s (i.e., g: [n]→[s], where Pr[g(i)=j]=1/s for i∈[n], j∈[s]). Hence, the element $S_{ij}$ is one where g(i) is j and 0 otherwise (i.e., $S_{ij}$=1 for g(i)=j, otherwise 0). The effect is to separate out the contributions of the coefficients in order to separate i from a set of K if for all j that is an element of K where g as a function of i is not equal to g as a function of j (i.e., $\forall j \in K$, g(i)≠g(j)). For the exemplary embodiments, the mapping of g is three-wise independent and s is set at the quantity of 16 times the product of k and log n all divided by $\epsilon^2$ (i.e., s=(16k log n)/$\epsilon^2$). This ensures sufficient probability that any i is separated from the largest coefficients.

The microseparation matrix 302 utilizes a standard Hamming code-like structure to find the identity of the coefficients. This process is akin to non-adaptive group testing. A Hamming code is an error correcting code that may detect single and double bit errors and correct single bit errors. If the microseparation matrix 302 is denoted as H, then H is a 0/1 (1+2[$\log_2$n])×n matrix derived from the 1+2[$\log_2$n]×$2^{\log_2 n}$ Hamming code matrix by taking the first n columns. If M denotes the Hamming matrix, then $H_{2i}=M_i$ and $H_{2i-1}=H_0-M_i$ (recalling that $H_0$ is a row of all 1's). If bit(i,j) is a function that returns the jth bit of i in the binary representation of i, then formally, $H_{0,j}=1$, $H_{2i,j}$=bit(i,j), and $H_{2i-1,j}$=1−bit(i,j) for i=1 . . . log n.

The estimation vector 303 is an accurate estimator that calculates an estimate for the coefficients. If the estimation vector 303 is denoted as E, then E is a ±1 valued vector of length n so that the probability of $E_i$ equaling 1 is the same as the probability of $E_i$ equaling −1 which should both be ½ (i.e., Pr[$E_i$=1]=Pr[$E_i$=−1]=½). Using a function h, matrix n is linearly transformed into {−1, +1} to refer to E, so that $E_i$ equals h(i) (i.e., h: [n]→{−1, +1}, $E_i$=h(i)). h is only required to be four-wise independent.

Those of skill in the art will understand that T may be composed from S, H, and E by: T=S⊗H⊗E, where ⊗ is a tensor-like linear operator. By letting m=s (2 log n+1), T is a m×n matrix. Furthermore, T may be specified in O(log n) bits. The set of m vectors Ψ'=TΨ may be constructed in time O($n^2$ log n).

It should be noted that for more structured dictionaries Ψ which are themselves sparse (e.g., Haar wavelet basis), or highly structured (e.g., Discrete Fourier basis), further improvements that are nearly linear in the dimensions of Ψ' may be possible, in terms of the running time costs.

The reconstruction of coefficients 203 is the process of taking the transformation matrix 304 and putting it through the decoding procedure 305 to reconstruct the coefficients. The decoding procedure 305 will be discussed in detail below.

The decoding procedure 305 considers each set of inner products generated by the row $S_j$. When composed with (H⊗E), this leads to 1+2 $\log_2$ n inner products, $(T\Psi A)_{j(1+2\log n)} \ldots \theta'_{(j+1)(1+2\log n)-1}$ which may be denoted as $x_0 \ldots x_{2\log n}$. The coefficients may be decoded by comparing the squares of the inner product values (e.g., $x_{2l}^2$ with $x_{2l-1}^2$). If $x_{2l}^2$ is greater than $x_{2l-1}^2$, then $b_l$ is set at 1, otherwise, the value is set at 0. It is then found that i equals the sum of $b_l 2^{l-1}$ where l goes from 1 to log n (i.e., i=$\sum_{l=1}^{\log n} b_l 2^{l-1}$). Then i is added to the set of approximate coefficients, θ. $\theta_i$ is estimated at h(i)$x_0$ and outputs as the approximate k largest coefficients those obtaining the k largest values of |$\theta_i$|.

Several statements may be made from the results of the decoding procedure 305. First, for every coefficient $\theta_i$ with the square of $\theta_i$ greater than the quantity $\epsilon^2$ divided by 2k multiplied by the square of the Euclidean norm of the difference vector $R_{opt}^k$ less A (i.e., $\theta_i^2 > (\epsilon/2k) \|R_{opt}^k - A\|_2^2$), there is a constant probability that the decoding procedure will return i. Second, an estimate of $\theta_i$ as $\theta_i$ such that |$\theta_i^2 - \theta_i^2$| ≤ ($\epsilon^2$/2k)$\|R_{opt}^k-A\|_2^2$ and $(\theta_i-\theta_i)^2 \leq (\epsilon^2/k)\|R_{opt}^k-A\|_2^2$ with constant probability. Third, by taking O(ck $\log^3$n/$\epsilon^2$) measurements, an estimate of $\theta_i$ as $\theta_i$ for every coefficient 1≤i≤n, such that |$\theta_i^2-\theta_i^2$|≤($\epsilon^2$/2k)$\|R_{opt}^k-A\|_2^2$] and $(\theta_i-\theta_i)^2 \leq (\epsilon^2/k)\|R_{opt}^k-A\|_2^2$ with probability of at least 1−$n^{-c}$ may be obtained. Fourth, given θ(A)={$\theta_i$(A)} such that both |$\theta_i^2-\theta_i^2$|≤($\epsilon^2$/2k)$\|R_{opt}^k-A\|_2^2$ and $(\theta_i-\theta_i)^2 \leq (\epsilon^2/2k)\|R_{opt}^k-A\|_2^2$ for all i, picking the k largest coefficients from θ(A) gives a (1+$\epsilon^2$) approximation of the optimal k term representation of A. Fifth, the decoding process takes time O($c^2$k $\log^3$n/$\epsilon^2$).

Those of skill in the art will understand that with probability at least 1−$n^{-c}$, and in time O($c^2$(k/$\epsilon^2$)$\log^3$n), a representation R of A under Ψ may be found such that $\|R-A\|_2^2 \leq (1+\epsilon^2)\|R_{opt}^k-A\|_2^2$ and $\|R\|$ has support k. The dictionary Ψ'=TΨ has O(ck $\log^3$ n/$\epsilon^2$) vectors, and is constructed in time O(c$n^2$ log n). T is represented with O($c^2$ log n) bits.

Furthermore, if A has a support k under Ψ, then a representation R under Ψ may be found where the size of Ψ' is O(k $\log^2$n) so that with probability at least 1−$n^{-c}$, the exact representation R of A may be found. If A is p-compressible under Ψ, then Ψ' may be built with size O(k $\log^3$ n) so that with probability at least 1−$n^{-c}$, a representation R of A under Ψ may be found such that $\|R-A\|_2^2 \leq (1+\epsilon^2)C'k^{1-2/p}$. For the k-sparse case, the log n factor may be shaved off the size of s, because there are no coefficients causing collisions beyond the k largest.

When defining the transform matrix 202 with non-adaptive cases (e.g., p-compressible case, k-support case), a non-adaptive dictionary transform may be performed. The same analysis may be performed for both the non-adaptive p-compressible and k-support cases. In fact, when θ has support k, estimation may be done exactly since the analysis is done more tightly. The analysis for the p-compressible case will be discussed in detail below. Again, it should be noted that the analysis applies to the k-support case as well.

In the p-compressible case, the coefficients (sorted by magnitude and normalized) obey |$\theta_i$|=O($I^{-1/p}$) for appropriate scaling constants and some parameter p. Previous work has focused on the cases 0<p<1. Integrating shows that $\sum_{i=k+1}^{n} \theta_i^2 = \|R_{opt}^k - A\|_2^2 = O(k^{1-2/p})$. This model essentially states that distribution of coefficients has a tail of small weight. Thus, this model may be used to create a matrix T for any signal A obeying this property. The intuition is that rather then ensuring separation for just the k largest coefficients, separation for the top k' coefficients is guaranteed (where k' is chosen so that the remaining coefficients are so small that even if taken all together, the error introduced to the estimation of any coefficients is so small that it is within the allowable error bounds).

From this analysis and model, there exists a set of O($k^{(3-p)/(1-p)}$ $\log^2$ n) vectors Ψ' so that any p-compressible signal may be covered with error O($\|R_{opt}^k-A\|_2^2$). Moreover, there is a Las Vegas style randomized algorithm to find such a set of inner products. The Las Vegas style randomized algorithm is a randomized algorithm that always produces correct results with the only variation from one run to another being its running time. The proof for the theorem may be shown with the following.

With the same construction of T and decoding procedure discussed above except that the parameters are changed to take advantage of the information from the p-compressible case, the decay is guaranteed in size of the coefficients to be able to guarantee accurate recovery of the original signal. The square of the absolute sums of coefficients after removing the top k' is $(\Sigma_{i=k'+1}{}^n |\theta_i|)^2 = O(k'^{2-2/p})$. When set equal to $\theta_k{}^2 = O(k^{-2/p})$, then $k' = O(k^{1/(1-p)})$. By choosing a k' and setting $s = \Omega(k')$, the probability of any of the top k' coefficients colliding with any $\theta_i$ for $i \in K \in [n]$ (where $|K| = kk'$) under g is at most a small constant (e.g., 1/8). Then by taking enough repetitions of T, at least half the repetitions i is not separated from any of the top k' coefficients with probability $o(n^{-kk'})$. This may be done using $O(\log n^{kk'})$ repetitions, using a standard Chernoff bounds argument. It should be noted that the number of ways of picking K and the top k' coefficients are $O(n^{kk'})$ such possibilities. The probability of failure on any of these choices is $O(n^{-kk'} n^{kk'}) = O(1)$. Consequently, there must exist a set of repetitions of T with this property. Moreover, drawing such a set randomly succeeds with at least constant probability. Hence, a Las Vegas algorithm may be given to find such a set by building one and testing whether, for all choices of K and the top k' coefficients, it has this deterministic strong separation property. If the property is exhibited, then it is accepted, otherwise this process is repeated until one is found. Previous work was not clear on how to check whether a given transform matrix has the necessary non-adaptive properties.

With this, given a set of inner products with the deterministic separation property, it may be guaranteed to recover the top k coefficients. The observation is that for each of the top k coefficients, there is now guaranteed to be a set of $(1+2 \log n)$ inner products x (as in Lemma 402) such that none of the top k coefficients collide under g. The only failure to recover coefficient i is if $(\Sigma_{g(j)=g(i), j>k}, h(j)\theta_j)^2 > \theta_i{}^2$: if the items from the k' tail colliding with i under g are enough to give the wrong answer in comparison to $\theta_i{}^2$. But this sum is at most $(\Sigma_{j=k'+1}{}^n |\theta_j|)^2$, which by choice of k' is less than $\theta_k{}^2$, so for $i \leq k$, this event cannot happen, no matter what values of g and h taken.

This ensures that the identity of the top k coefficients is recoverable. However, in total, a set of K of coefficients with $|K| \leq kk'$ is recovered. To estimate the size of each of these coefficients accurately, the error in estimation of each such coefficient may be bounded to $(1/k)(\|R_{opt}{}^k - A\|_2{}^2)$ if in at least half of the estimates of $\theta_i$, the top k coefficients is avoided, since k' satisfies $(\Sigma_{j=k'+1}{}^n |\theta_i|)^2 \leq (1/k)(\|R_{opt}{}^k - A\|_2{}^2) = O(k^{-2/p})$. Since the maximum error in estimation is bounded as $|\theta_i{}^2 - \theta_i{}^2| \leq O((1/k)(\|R_{opt}{}^k - A\|_2{}^2))$ and $(\theta_i - \theta_i)^2 \leq O((1/k)(\|R_{opt}{}^k - A\|_2{}^2))$, a representation of A as R with error $O(\|R_{opt}{}^k - A\|_2{}^2)$ is recoverable.

The overall number of inner products needed is $O(kk'^2 \log^2 n)$: $O(k' \log n)$ to guarantee constant probability of separation for each repetition of T, and $O(kk' \log n)$ repetitions of T to give deterministic strong separation. Thus the overall number of inner products is $O(k^{1+2/(1-p)} \log^2 n) = O(k^{(3-p)/(1-p)} \log^2 n)$.

Those of skill in the art will understand that there exists a set of $O(k^2 \log n \log n/k)$ vectors $\Psi'$ so that any signal with support k may be recovered exactly, and there exists a Las Vegas style randomized algorithm to find such a set of expected time $\tilde{O}(k^3 n^k)$.

In addition, several recent works in compressed sensing have shown that compressed sensing style techniques allow accurate reconstruction of the original signal even in the presence of error in the measurements (i.e., omission or distortion of certain $\theta_i$'s). The same model of error is adopted in order to show that a certain level of error resilience comes for free with the construction of the present invention. Thus, if a fraction $\rho = O(\log^{-1} n)$ of the measurements are corrupted in an arbitrary fashion, a representation R with error $\|R - A\|_2{}^2 \leq (1 + \epsilon) \|R_{opt}{}^k - A\|_2{}^2$ is still recoverable.

Those of skill in the art will understand that in considering the recovery of $\theta_i$ from T, i may be recovered provided the previous conditions hold, and additionally the log n measurements of $\theta_i$ are not corrupted. It should be noted that i is still recoverable under corruption. Provided $\rho \leq 1/(3 \log n)$ then all log n measurements are uncorrupted with constant probability at least 2/3 and hence i may be recovered with constant probability. Similarly, estimating $\theta_i$ takes the median of $O(\log n)$ estimate, each of which is accurate with constant probability. If the probability of an estimate being inaccurate or an error corrupting it is still constant, then the Chernoff bounds argument guarantees accurate reconstruction. As long as $\rho$ is less than a constant (e.g., 1/10), then this also holds with constant probability. Combining these, the signal to the same level of accuracy using $O((k \log^3 n)/\epsilon^2)$ measurements is recoverable, if $\rho \leq 1/(3 \log n)$.

The bounds on $\rho$ may be strengthened to $O(1)$, at the expense of higher decoding cost, by directly estimating all $\theta_i$. The construction is also resilient to other models of error (e.g., measurements being perturbed by some random vector of bounded weight). Provided the weight of the perturbation vector is at most $e\|R_{opt}{}^k - A\|_2{}^2$, for some constant e, then it is straightforward to modify the earlier proofs to tolerate such error, since in expectation, it may be argued that the error introduced into each measure is bounded by $(((1+e)e)/(k \log^2 n))(\|R_{opt}{}^k - A\|_2{}^2)$, and so the overall accuracy will be $(1+(1+e)e)\|R_{opt}{}^k - A\|_2{}^2$.

It will be apparent to those skilled in the art that various modifications may be made in the present invention, without departing from the spirit or scope of the invention. Thus, it is intended that the present invention cover the modifications and variations of this invention provided they come within the scope of the appended claims and their equivalents.

What is claimed is:

1. A method, comprising:
   receiving a signal for transmission; and
   encoding the signal into a plurality of linear projections representing the signal, the encoding includes:
   defining a transform matrix, wherein the transform matrix recovers k coefficients so that an error from using the k coefficients is within a $(1+\epsilon^2)$ factor of using the k largest coefficients, the defining the transform matrix includes:
   processing the signal using a macroseparation matrix;
   processing the signal using a microseparation matrix; and
   processing the signal using an estimation vector.

2. The method of claim 1, wherein the processing the signal using the macroseparation matrix occurs before the processing using the microseparation matrix and the estimation vector.

3. The method of claim 1, wherein the processing the signal using the microseparation matrix occurs before the processing using the estimation vector.

4. The method of claim 1, wherein the macroseparation matrix is a 0/1 s×n matrix having exactly one entry being 1 and the remaining entries being 0 for each column.

5. The method of claim 1, wherein the microseparation matrix is a 0/1 $(1+2[\log_2 n]) \times n$ matrix derived from a $1+2[\log_2 n] \times 2^{\log_2 n}$ Hammering code matrix.

6. The method of claim 1, wherein the estimation vector is a ±1 valued vector of length n.

7. A system, comprising:
   a receiving module to receive a signal for transmission; and an encoding module to encode the signal into a plurality of linear projections representing the signal, the encoding includes:

defining a transform matrix, wherein the transform matrix recovers k coefficients so that an error from using the k coefficients is within a $(1+\epsilon^2)$ factor of using the k largest coefficients, the defining the transform matrix includes:

processing the signal using a macroseparation matrix;

processing the signal using a microseparation matrix; and processing the signal using an estimation vector.

8. The system of claim 7, wherein the processing the signal using the macroseparation matrix occurs before the processing using the microseparation matrix and the estimation vector.

9. The system of claim 7, wherein the processing the signal using the microseparation matrix occurs before the processing using the estimation vector.

10. The system of claim 7, wherein the macroseparation matrix is a 0/1 s×n matrix having exactly one entry being 1 and the remaining entries being 0 for each column.

11. The system of claim 7, wherein the microseparation matrix is a 0/1 $(1+2[\log_2 n]) \times n$ matrix derived from a $1+2[\log_2 n] \times 2^{\log_2 n}$ Hammering code matrix.

12. The system of claim 7, wherein the estimation vector is a ±1 valued vector of length n.

13. A system comprising a memory storing a set of instructions and a processor to execute the set of instructions executable, the set of instructions being operable to:

receive a signal for transmission; and encode the signal into a plurality of linear projections representing the signal, the encoding includes:

defining a transform matrix, wherein the transform matrix recovers k coefficients so that an error from using the k coefficients is within a $(1+\epsilon^2)$ factor of using the k largest coefficients, the defining the transform matrix includes:

processing the signal using a macroseparation matrix;

processing the signal using a microseparation matrix; and processing the signal using an estimation vector.

14. The system of claim 13, wherein the processing the signal using the macroseparation matrix occurs before the processing using the microseparation matrix and the estimation vector.

* * * * *